United States Patent
Thoben et al.

(10) Patent No.: US 7,816,781 B2
(45) Date of Patent: Oct. 19, 2010

(54) POWER SEMICONDUCTOR MODULE

(75) Inventors: Markus Thoben, Soest (DE); Richard Boettcher, Warstein (DE); Marc Buschkuehle, Erwitte (DE); Hartwig Rueckert, Soest (DE)

(73) Assignee: Infineon Technologies AG, Neubiberg (DE)

( * ) Notice: Subject to any disclaimer, the term of this patent is extended or adjusted under 35 U.S.C. 154(b) by 142 days.

(21) Appl. No.: 11/866,055

(22) Filed: Oct. 2, 2007

(65) Prior Publication Data

US 2009/0085189 A1 Apr. 2, 2009

(51) Int. Cl.
*H01L 23/48* (2006.01)

(52) U.S. Cl. ............... 257/693; 257/698; 257/E23.01; 438/106

(58) Field of Classification Search ............... 257/693, 257/698, E23.01, E21.506; 438/106
See application file for complete search history.

(56) References Cited

U.S. PATENT DOCUMENTS 4,446,505 A 5/1984 Long et al.
4,585,293 A 4/1986 Czeschka et al.
5,199,879 A * 4/1993 Kohn et al. ............... 439/63
5,715,595 A * 2/1998 Kman et al. ............... 29/845
5,966,291 A * 10/1999 Baumel et al. ............ 361/707
6,593,535 B2 * 7/2003 Gailus ........................ 174/262

FOREIGN PATENT DOCUMENTS

EP 0367660 A2 5/1990
EP 0825680 A2 2/1998

* cited by examiner

*Primary Examiner*—Thinh T Nguyen
(74) *Attorney, Agent, or Firm*—Dicke, Billig & Czaja, PLLC

(57) ABSTRACT

One embodiment provides a semiconductor module with an electrically insulating substrate. A conductor track is arranged on the substrate. A semiconductor chip and sleeve member are arranged on the substrate and electrically connected to the conductor track. The sleeve member includes a rim with a maximum inner diameter. The module further includes a contact element. The contact element includes a first end arranged within and electrically connected to the sleeve member, a second end providing an external contact of the module, and a section arranged between the first end and the second end. The section includes a maximum outer diameter that is larger than the maximum inner diameter of the rim. The contact element is in mechanical contact with the sleeve member such that the section between both ends of the contact element is arranged outside the sleeve member and borne on the rim of the sleeve member.

9 Claims, 2 Drawing Sheets

FIG 1
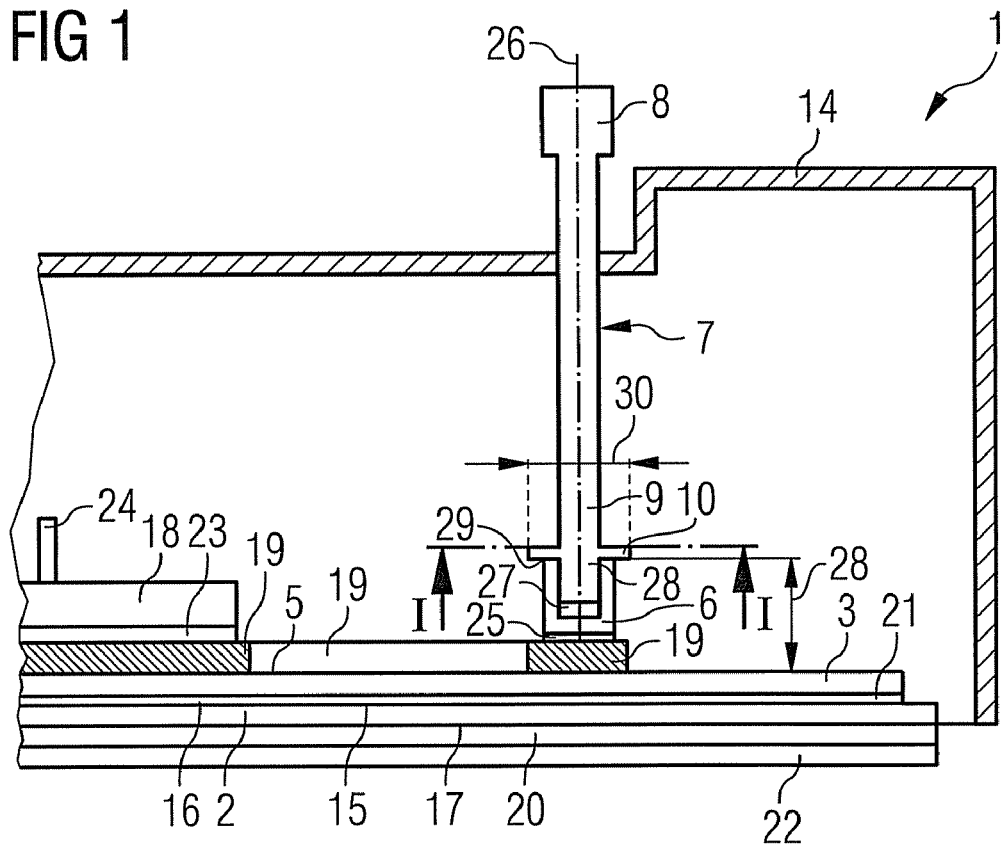
FIG 2  I-I
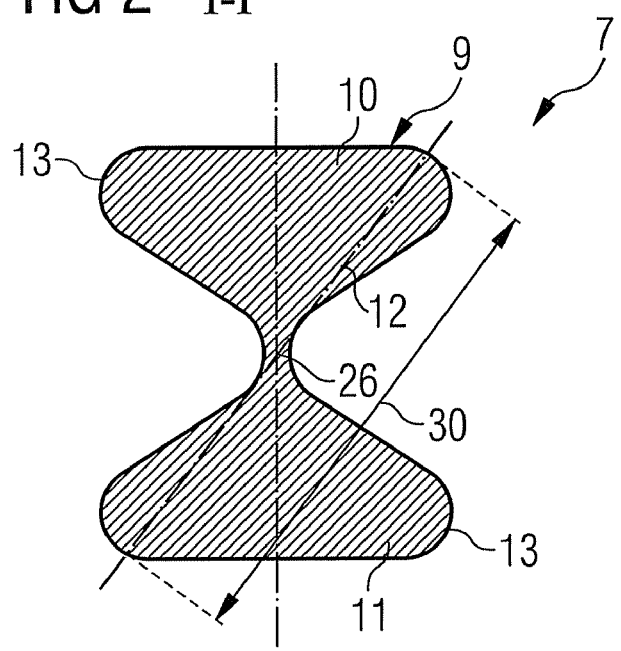

POWER SEMICONDUCTOR MODULE

BACKGROUND

The present invention relates to a power semiconductor module.

A power semiconductor module or power module is designed to operate at relatively high voltages or higher currents. The power module may include silicon-controlled rectifiers (SCR), power transistors, insulated-gate bipolar transistors (IGBT), metal-oxide semiconductor field-effect transistors (MOSFET), power rectifiers, or power regulators. A power module in operation, because of the high power it consumes, generates a large amount of heat. The power module may also be operated in an environment that has an elevated temperature, for example, in an engine compartment of a motor vehicle or a train. The heat generated by the power module is dissipated by a heat sink attached to the package of the operational power module. There is a general need to improve heat dissipation with power semiconductor modules.

SUMMARY

One or more embodiments provide a power semiconductor module including an electrically insulating substrate. The substrate includes two surfaces. A conductor track is arranged on one of the surfaces of the substrate. A semiconductor chip is arranged on the substrate and electrically connected to the conductor track. A tubular sleeve member is arranged on the substrate and electrically connected to the conductor track. The tubular sleeve member includes an opening encircled by a rim with a maximum inner diameter. The power semiconductor module further includes an elongated contact element. The contact element includes a first end arranged within and electrically connected to the sleeve member. The contact element further includes a second end providing an external contact of the module and a section arranged between the first end and the second end of the contact element. The section between both ends of the contact element includes a maximum outer diameter which is larger than the maximum inner diameter of the rim of the sleeve member. The contact element is in mechanical contact with the sleeve member such that the section between both ends of the contact element is arranged outside the sleeve member and borne on the rim of the sleeve member.

Further, a method for assembling a power semiconductor module is disclosed, the method including: First, an electrically insulating substrate that includes two surfaces and a conductor track arranged on one of the surfaces of the substrate is provided. Then, a semiconductor chip is arranged on the substrate where the semiconductor chip is electrically connected to the conductor track. A tubular sleeve member is arranged on the substrate where the sleeve member is electrically connected to the conductor track and includes an opening encircled by a rim with a maximum inner diameter. An elongated contact element is provided which includes a first end arranged within and electrically connected to the sleeve member. A second end of the contact element provides an external contact of the module. A section of the contact element is arranged between the first end the second end of the contact element. The section between both ends of the contact element includes a maximum outer diameter which is larger than the maximum inner diameter of the rim of the sleeve member. Finally, a mechanical contact is established between the contact element and the sleeve member such that the section between both ends of the contact element is arranged outside the sleeve member and borne on the rim of the sleeve member.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a partial cross-sectional view of a novel power module.

FIG. 2 illustrates a cross-sectional view of the pin used in the power module of FIG. 1 at the section I-I in FIG. 1.

DETAILED DESCRIPTION

Figure 3:
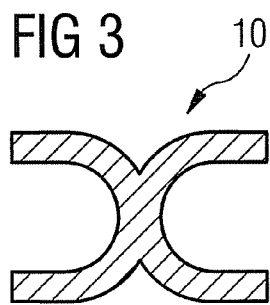
FIG. 3 illustrates a cross-sectional view of the pin illustrated in FIG. 1 at the section I-I in a second example.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

FIG. 1 illustrates in a partial cross-sectional view an exemplary novel power module 1. The power module 1 includes a base-plate 2 arranged in a casing 14. A substrate 3 is located above the base plate 2. A sleeve member 6 is mounted on the substrate 3. One end of a pin 7 is provided in the sleeve member 6. The base-plate 2 has a layer of base-plate solder 21 provided on its top surface 16 and a layer of thermal grease 20 is provided on its bottom surface 17. The base-plate solder 21 connects the base-plate 2 to the substrate 3 whilst the layer of thermal grease 20 connects the base-plate 2 to a heat sink 22.

The base-plate 2 includes copper material and has a thickness of 2 mm to 5 mm, e.g., 3 mm (millimeter) whereas the heat sink 22 includes aluminium material. Other materials for the heat sink are applicable as well. The substrate 3 has a plurality of copper tracks 19 disposed on its top surface 5 and a layer of copper arranged on its bottom surface 15. Only one of these copper tracks 19 of these is illustrated in FIG. 1. The substrate 3 includes a layer of aluminium oxide of 250 µm to 630 µm, preferably 380 µm (micrometer) thickness.

At least one power semiconductor chip 18 is arranged on the copper tracks 19. The power semiconductor chip 18 is attached to the substrate 3 and may be attached to the copper track 19 by a layer 23 of chip-solder. A plurality of aluminium bonding wires 24 connects the power semiconductor chip 18 to an adjacent copper track 19. The copper track 19 has a thickness of 200 µm to 500 µm, e.g., 300 µm (micrometer) wherein the sleeve member 6 is arranged on the copper track 19. A first sleeve solder 25, bonds and electrically connects the sleeve member 6 onto the copper track 19. The sleeve member 6 is attached to the copper track 19 such that an axis of the sleeve member 6 is perpendicular to the top surface 5 of the substrate 3 whereon the copper track 19 is disposed. The tubular sleeve member 6 is hollow cylinder shaped and includes copper material. Other shapes of the sleeve member are applicable as well. The shape of the hollow volume within the sleeve member 6 is of symmetry to the cutting plane of the sleeve member 6. The sleeve member 6 includes an opening encircled by a rim 29 with a maximum diameter.

Pin 7 is a contact element and has a first end at the bottom and a second end at the top where the second end of the pin 7 is used as electrical terminal 8 and is intended for connection to an external electrical source or contact. The electrical terminal 8 may include a section shaped such that the pin 7 is in frictional contact with the external electrical source or contact. This section of the electrical terminal 8 may be located outside the power module 1. Pin 7 includes between the first end 9 and the second end of the pin 7 an enlarged section used as a stamped section 10. The pin 7 includes copper material. Other materials than copper, such as brass, bronze, or alloys of these materials are possible as well. The stamped section 10 is located outside of the sleeve member 6 while the first end 9 is inserted into the sleeve member 6. The outer surface of the first end 9 is in contact with the inner surface of the sleeve member 6 and may be in contact with a second sleeve solder 27 located inside of the sleeve member 6.

Pin 7 has an elongated shape with an cutting plane 26 oriented perpendicularly to the top surface 5 of the substrate 3 whereon the copper track 19 is disposed. Pin 7 has a symmetric shape with respect to the cutting plane 26. Other shapes of pin 7 are applicable as well. The pin 7, whose first end 9 is arranged within the sleeve member 6, is oriented in parallel to the sleeve member which is also arranged perpendicular to the top surface 5 of the substrate 3.

The stamped section 10 is arranged outside the sleeve member 6 and includes a maximum outer diameter 30, which is larger than the maximum inner diameter of the sleeve member 6. The stamped section 10 between both ends of the pin 7 is in mechanical contact with the sleeve member 6 such that the section 10 is borne on the rim 29 of the sleeve member 6. The stamped section 10 extends in a plane perpendicular to the cutting plane 26 of pin 7 with respect to the first end 9. When the first end 9 of pin 7 is inserted into the sleeve member 6 the stamped section 10 collides with a top surface of the sleeve member 6 which is oriented away from the top surface 5 of the substrate 3 and is located in a plane perpendicular to the cutting plane 26 of pin 7.

The axis of the sleeve member 6 is perpendicular to the top surface 5 of the substrate 3 and parallel to the cutting plane 26 of pin 7. With the stamped section 10 being borne on the rim 29 of the sleeve member 6 the mechanical contact between the stamped section 10 and the sleeve member 6 during collision of the stamped section 10 with the sleeve member 6 is established in a plane perpendicular to the cutting plane 26 of the pin 7. The first end 9 is inserted in the sleeve member 6 parallel to the cutting plane 26 of pin 7. The shape of the second sleeve solder 27 in contact with the first end 9 of pin 7 is thus symmetrical to the cutting plane 26 of the pin 7. When being arranged within the sleeve member 6, the first end 9 of pin 7 therefore exerts no forces to the second sleeve solder 27 and the sleeve member 6 in a direction parallel to the top surface 5 of the substrate 3. The stamped section 10 between both ends of the pin 7 includes a bed stop in contact with the top surface at the rim 29 of the sleeve member 6 for a predetermined distance between the lower surface of the first end 10 and a bottom surface of the sleeve member 6 facing each other. The distance between the bottom surface of the first end 9 of pin 7 and the bottom of the sleeve member 6 is determined by the height 28 of the bed stop of the stamped section 10 over the top surface 5 of the substrate 3 minus the height of the inner surface of the sleeve member 6 being parallel to the top surface 5 over the top surface 5 of the substrate 3. The stamped section 10 between both ends of pin 7 is shaped such that the buckling risk of the contact element is not increased by this section 10.

FIG. 2 illustrates in a cross-sectional view the stamped section 10 of the pin 7 of FIG. 1, along line I-I. The stamped section 10 includes flanges 11 and a girder 12 that provides a connection between the flanges 11. The flange 11 is generally of a triangular shape and the girder 12 is of rectangular shape. The flanges 11 are in mechanical contact with and borne on the rim 29 of the tubular sleeve member 6 (see FIG. 1). The flanges 11 may be less deformable than the first end 9 arranged within the sleeve member 6. A distance between outer edges of each of the flanges 11 is the maximum diameter 30.

The exemplary power module includes an electrically insulating substrate in the form of an insulating substrate 3 in the present case. The copper track 19 is a type of a conductive connection track, which is an area of electrically conductive material. The sleeve member 6 is provided as a type of a deformable tubular sleeve member, forming an electrically conductive connector member. The sleeve member 6 may be soldered onto the metal connection track 19 by a method known as brazing.

The power semiconductor chip 18 is capable of handling high voltage or current and may be, for example (but not limited to) a silicon-controlled rectifier SCR, a power transistor, an insulated gate bipolar transistor IGBT, a metal oxide semiconductor field effect transistor MOSFET, a power rectifier, or a power regulator. Pin 7 has the shape of an elongated contact element, a bus bar, a plug-in connector, or the like. The shaped section 10 between both ends of the pin 7 is herein referred to as a stamped section or crimped section. In the present example, the elongated contact element is connected to the deformable tubular sleeve member without solder. This allows easy assembly of the elongated contact element with the insulating substrate without a need for special equipment. The conductive connection track may include a metal such as aluminium, an alloy of aluminium, copper or an alloy of copper.

Figure 4:
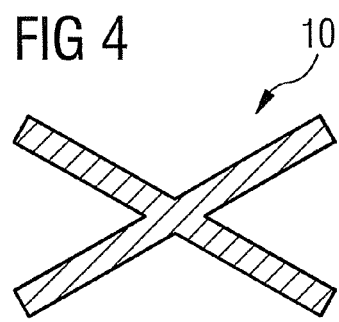
FIG. 4 illustrates a cross-sectional view of the pin illustrated in FIG. 1 at the section I-I in a third example.
Figure 5:
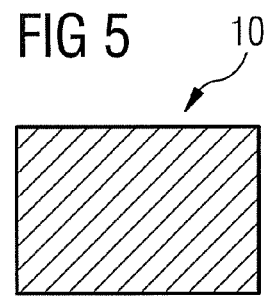
FIG. 5 illustrates a cross-sectional view the pin illustrated in FIG. 1 at the section I-I in a fourth example.

FIG. 3 is a cross-sectional view of another stamped section. The cross-section of the section has the shape of a "back-to-back U". As illustrated in FIG. 4, a cross-sectional shape of an "X" is also possible. A shape of the section 10 of pin 7 in form of a rectangle is illustrated in FIG. 5. Section 10 of pin 7 may have a cross-sectional shape of a circular plate. In this case the shape of section 10 is symmetric to cutting plane 26 of pin 7.

Figure 6:
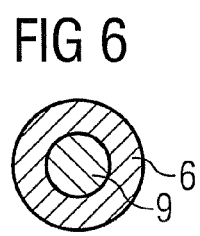
FIG. 6 illustrates a cross-sectional view of a pin inserted in a sleeve member.
Figure 7:
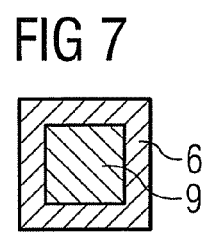
FIG. 7 illustrates a cross-sectional view of another pin inserted in a corresponding sleeve member.
Figure 8:
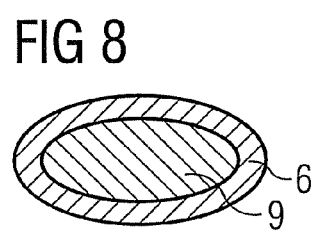
FIG. 8 illustrates a cross-sectional view of still another pin inserted in a corresponding sleeve member.
Figure 9:
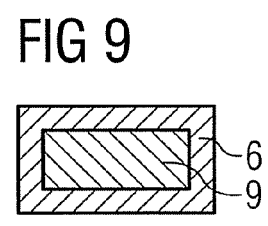
FIG. 9 illustrates a cross-sectional view of still another pin inserted in a corresponding sleeve member.

The sleeve member 6 is a receiving contact element or member. The receiving contact element may be a kind of an electrically conductive connector member. The shape of a receiving contact member may be of a hollow cylinder as illustrated in FIG. 6, of a quadrangular block with a hollow centre as illustrated in FIG. 7, of a hollow cylinder with a cross-section of an oval ring as illustrated in FIG. 8, or of a rectangular block with a hollow centre as illustrated in FIG. 9. The angle of the axis of the receiving contact member to the top surface 5 of the insulating substrate 3 may be perpendicular. Other angles may be appropriate depending on the design of the power module.

The first end 9 of pin 7 is a contact connector element which forms an elongated contact element. The shape of the contact connector element is appropriately chosen to engage with the receiving contact element. The contact connector element has a shape for insertion into the receiving contact element as illustrated in FIGS. 6 to 9. Alternatively, the contact connector element of pin 7 may have a shape adopted to enclose the receiving contact element illustrated in FIG. 1 as the sleeve member 6. The contact connector element may include a spring section and utilise a conductive material such as copper or an alloy of copper.

The base-plate 2 together with the heat sink dissipates heat generated within the operational power module 1. The layer of thermal grease 20 and the layer of base-plate solder 21 act to reduce the thermal resistance between the substrate 3 and the heat sink 22. The substrate 3 provides an electrical isolation between the power semiconductor chips 18 that are on the one side of the substrate 3 and the base-plate 2 that is on the other side of the substrate 3. The copper tracks 19 and the aluminium bonding wires carry high current among the power semiconductor chips 18. The layer of copper on the bottom surface 15 of the substrate 3 bonds the substrate 3 to the layer of base-plate solder and provides low thermal resistance between the substrate 3 and the heat sink.

A method of producing the power module 1 includes the provision of the base-plate 2 and the pin 7. A first end of the pin 7 is stamped to form the stamped section 8. A section 10 is stamped between the first end 9 and a second end of the pin 7. The layer of base-plate solder is then deposited on the top surface 16 of the base-plate 2. The insulating substrate 3 is then placed onto the top surface 16 of the base-plate 2. The insulating substrate 3 and the base plate 2 are subjected to elevated temperature for a period for the base-plate solder to bond the base plate 2 onto the insulating substrate 3.

In a similar manner, the power semiconductor chips 18 are bonded onto the copper tracks 19 of the insulating substrate 3 by the chip-solder and the sleeve member 6 is bonded onto the copper track 19 of the insulating substrate 3 by a layer of sleeve solder. The sleeve member 6 includes an opening encircled by a rim 29 with a maximum inner diameter. The first sleeve solder 25 has a melting point that is below the melting point of the copper track 19 and the melting point of the sleeve member 6. This prevents the copper track 19 and the sleeve member 6 from melting during the bonding or brazing process the sleeve member 6 to the copper track 19. The first sleeve solder 25 is molten during this process of bonding and is drawn by capillary action into the inner part of the sleeve member 6.

The amount of the first sleeve solder 25 drawn into the sleeve member 6 may not be constant as there may be a foreign substance, such as oil, on the surface of the sleeve member 6, which affects the drawing of the first sleeve solder 25 into the sleeve member 6. Similarly, any foreign substance on the sleeve member 6 and the copper track 19 also affects the volume of the first sleeve solder 25 placed underneath the sleeve member 6 and may cause a shift in the position of the sleeve member 6.

Then, aluminium bonding-wires 24 are attached to the power semiconductor chips 18 and the copper tracks 19. An elongated contact element with a cutting plane 26 in form of pin 7 is provided that includes a first end 9 arranged within an electrically connected to the sleeve member 6. The contact element further includes a second end with an electrical terminal 8 providing an external contact of the module 1. Between the first end 9 and the second end the contact element includes a section 10 with a maximum outer diameter 39. The maximum outer diameter 39 is larger than the maximum inner diameter of the rim 29 of the sleeve member 6. A mechanical contact is established between the contact element and the sleeve member 6 such that the shaped section 10 is arranged outside of the sleeve member 6 and borne on the rim 29 of the sleeve member 6.

Afterwards, the first end 9 may be drawn out of the sleeve member 6 such that a distance between the shaped section 10 and the sleeve member 6 is generated where the first end 10 is arranged within the sleeve member 6.

The outermost dimension of the first end 9 is slightly larger than the inner dimension of the sleeve member 6. The outer edges 13 of the first end 9 mark or score the inner surface of the sleeve member 6 when the first end 9 is inserted into the sleeve member 6. The sleeve member 6 is also deformed when the first end 9 is inserted.

The first end 9 experiences a dynamic frictional force during insertion of the first end 9 into the sleeve member 6 whilst the first end 9 experiences a static frictional force when the stamped section 9 is resting in the sleeve member 6. As the static frictional force is usually larger than the dynamic frictional force, the first end 9 is secured within the sleeve member 6 when the stamped section 9 is resting within the sleeve member 6.

The first end 9 and the sleeve member 6 do not suffer damage from the frictional force. The sleeve member 6 exerts a static frictional force on the first end 9 and may deform a part of the first end 9. The first end 9 reacts to the force from the sleeve member 9 by exerting a similar force on the sleeve member 6 which may deform the sleeve member 6. In a first stage, the deformation, also known as elastic deformation, is of a reversible type. In special cases, the deformation proceeds to a second stage where the deformation is of an irreversible type, known as plastic deformation. Nevertheless, frictional contact between first end 9 and the sleeve member 6 is maintained in both stages of deformation. The first end 9 is also deformed upon insertion into the sleeve member 6, both plastic and elastic deformation may occur. The frictional forces provide a low electrical resistance between the sleeve member 6 and the first end 9.

The connection, by frictional force, between the first end of the elongated contact element and the deformable tubular sleeve member allows for movement of the elongated contact element without causing damage to the deformable tubular sleeve member. This is different from a case in which the elongated contact element is soldered onto the deformable tubular sleeve member. In this case, a second sleeve solder 27 is inserted into the sleeve member 6 prior to arranging the first end 9 within the sleeve member 6. An electrical connection is provided between the first end 9 and the sleeve member 6 via the second sleeve solder 27.

The movement of the elongated contact element eases any stress on the deformable tubular sleeve member resulting from the deformable tubular sleeve member being out of the desired position. The deviation from the desired position may result in a lateral shift of the deformable tubular sleeve member relative to the conductive connection track or in a shift in the angle of the axis of the deformable tubular sleeve member relative to the metal connection track.

In another example, the deformable tubular sleeve member or contact connection member is secured to the substrate by a soldering technique known as brazing wherein the sleeve solder has a melting point below the melting point of the deformable tubular sleeve member or contact connection member. The brazing has the advantage that the deformable tubular sleeve member or contact connection member is not melted during the process of attaching the deformable tubular sleeve member or contact connection member onto the conductive connection track.

The examples provide a geometrically shaped pin which has a shaped section between two ends of the pin. The shaped section includes a bed stop in mechanical contact with a rim of the sleeve member when a first end of the pin is an electrical contact with the sleeve. The mechanical contact between the pin and the sleeve member is such that the stamped section outside the sleeve is borne on the rim of the sleeve. The shaped section is such that the stability of the pin against buckling is reduced only insignificantly. After joining the pin with the sleeve, the shaped section is placed in the vicinity of the upper rim of the sleeve. This is possible because the height of the sleeve and the height of the solder between the sleeve and the substrate is fluctuating only within a narrow range. The shaped section provides a rise of the joining force between the pin and the sleeve without damaging the sleeve. The shaped section is borne on the rim of the sleeve so that essentially no or very little lateral forces are exerted on the sleeve and on the solder connection between the sleeve and the conductive connection track in a plane perpendicular to the axis of the pin.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
   an electrically insulating substrate;
   a conductor track on the substrate;
   a semiconductor chip on the substrate and electrically connected to the conductor track;
   a sleeve on the substrate and electrically connected to the conductor track, the sleeve comprising a rim; and
   a contact element comprising a first end arranged within and electrically connected to the sleeve, a second end providing an external contact of the module, and a section arranged between the first end and the second end;
   wherein the section contacts the rim thereby preventing the first end of the contact element from engaging a bottom of the sleeve; and
   wherein the sleeve is configured with a side facing away from the substrate such that the first end of the contact element is inserted into that side of the sleeve.

2. The semiconductor module of claim 1, wherein the rim has a maximum inner diameter, wherein the section has a maximum outer diameter that is larger than the maximum inner diameter of the rim, and wherein the contact element is in mechanical contact with the sleeve such that the section is arranged outside the sleeve and engaged on the rim of the sleeve.

3. The semiconductor module of claim 1, wherein the section between both ends of the contact element comprises two flanges, the two flanges extend outwardly in opposite directions from each other, and wherein the flanges are in contact with the rim of the sleeve.

4. The semiconductor module of claim 1, wherein the sleeve is deformable and at least partially deformed.

5. The semiconductor module of claim 1, wherein the first end of the contact element arranged within the sleeve is deformable and at least partially deformed.

6. The semiconductor module of claim 1, wherein the contact element has a cutting plane and a shape of symmetry to the cutting plane of the contact element.

7. The semiconductor module of claim 3, wherein the flanges are less deformable than the first end of the contact element arranged within the sleeve.

8. The semiconductor module of claim 1, wherein the second end of contact element comprises a section shaped such that the contact element is in frictional contact with an external contact.

9. The semiconductor module of claim 1, wherein the section between both ends of the contact element comprises a bed stop for a predetermined distance between the first end of the contact element and a bottom of the sleeve within the sleeve.

* * * * *